(12) United States Patent
Li

(10) Patent No.: US 6,624,444 B1
(45) Date of Patent: Sep. 23, 2003

(54) ELECTRICAL-OPTICAL PACKAGE WITH CAPACITOR DC SHUNTS AND ASSOCIATED METHODS

(75) Inventor: Yuan-Liang Li, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/109,314

(22) Filed: Mar. 28, 2002

(51) Int. Cl.[7] ............................................... H01L 29/04
(52) U.S. Cl. ............................. 257/59; 257/72; 257/93; 257/98; 438/22; 438/25; 438/26; 438/27; 438/29
(58) Field of Search .......................... 250/551; 323/902; 257/59, 72, 93, 98; 438/22, 25–27, 29, 48, 128, 149, 151, 157, 283

(56) References Cited

U.S. PATENT DOCUMENTS

| | | | |
|---|---|---|---|
| 5,412,748 A | * 5/1995 | Furuyama et al. | ............ 385/92 |
| 5,751,009 A | * 5/1998 | Anderson et al. | ........... 250/551 |
| 5,834,799 A | * 11/1998 | Rostoker et al. | .............. 257/98 |

* cited by examiner

Primary Examiner—Nathan J. Flynn
Assistant Examiner—Scott Wilson
(74) Attorney, Agent, or Firm—Schwegman, Lundberg, Woessner & Kluth, P.A.

(57) ABSTRACT

An optical-electrical (OE) package includes a substrate electrically coupled to a motherboard via one or more capacitor DC shunts (CDCSs). In one embodiment, the substrate includes an IC chip electrically coupled to a first set of contact-receiving members on an upper surface of the substrate. The substrate also includes a light-emitting package and a photodetector package electrically coupled to respective second and third sets of contact-receiving members on the substrate lower surface. The substrate has internal wiring that electrically interconnects the IC chip, the light-emitting package and the photodetector array. The light-emitting package and the photodetector array are optically coupled to respective first and second waveguide arrays formed in or on the motherboard. The CDCSs mitigate noise generated by the IC chip by serving as a local current source.

26 Claims, 7 Drawing Sheets

ELECTRICAL-OPTICAL PACKAGE WITH CAPACITOR DC SHUNTS AND ASSOCIATED METHODS

TECHNICAL FIELD

Embodiments of the present invention relate to integrated circuit packaging and, in particular, relate to integrated circuit packages with optical interconnects.

BACKGROUND INFORMATION

The manufacturing of electronic and optoelectronic integrated circuits (ICs) involves complex lithographic processes to form microscopic solid-state devices and circuits in semiconductor wafers. These lithographic processes typically include forming layers of material on the wafer, patterning the layers, doping the substrate and/or the patterned layers, and heat-treating (e.g., annealing) the resulting structures. These processes are repeated to build up the IC structure. The result is a wafer containing a large number of ICs.

A "wafer sort" is then performed, wherein each IC chip on the wafer is electrically tested for functionality. The wafer is then separated ("diced") into the individual IC chips, which are then "packaged" individually or in groups for incorporation onto a printed circuit board (PCB) or a chip-on-board (COB).

An IC package is designed to provide physical and environmental protection for one or more IC chips, and electrical and/or optical interconnections with other IC chips or to a PCB. However, the typical IC chip has electrical leads in the form of pins or balls with a periodic spacing (pitch) on the order of a hundred microns, whereas a PCB has an electrical contact pitch on the order of a millimeter or so. Thus, when interfacing an IC chip to a PCB, a substrate package is typically provided between the IC chip and the PCB. The substrate package, also called an "interposer," is a passive device containing integrated circuit wiring arranged to perform the spatial transformation between the IC chip leads and the PCB contacts.

As central processing units (CPUs) increase in speed, they need increasing amounts of power to operate. This requires passing a high current through the leads, which in turns requires low-resistance leads to reduce power dissipation. Alternatively, a greater number of leads may be employed to lower the total resistance and thus lower the power dissipation. A large power dissipation in the leads results in higher temperatures, which negatively impacts chip reliability. High-power CPUs also require many power decoupling capacitors to reduce the noise in the power delivery system. Thus, the package for a high-power CPU tends to be complicated and expensive.

DETAILED DESCRIPTION OF EMBODIMENTS OF THE INVENTION

In the following detailed description of the embodiments of the invention, reference is made to the accompanying drawings that form a part hereof, and in which is shown by way of illustration specific embodiments in which embodiments of the invention may be practiced. These embodiments are described in sufficient detail to enable those skilled in the art to understand and implement them, and it is to be understood that other embodiments may be utilized and that changes may be made without departing from the scope of the present disclosure. The following detailed description is, therefore, not to be taken in a limiting sense, and the scope of embodiments of the present invention is defined only by the appended claims.

Figure 1A:
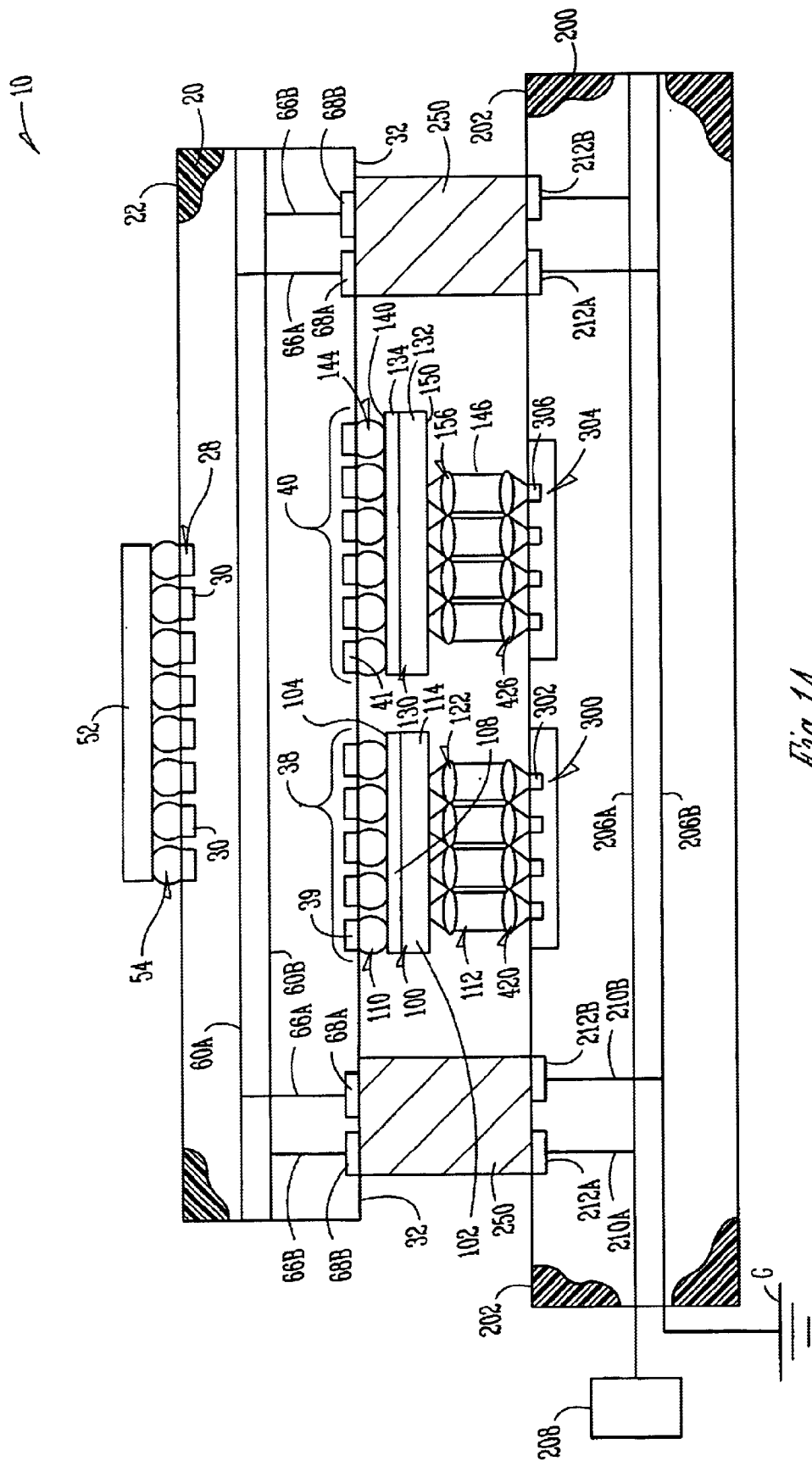
FIG. 1A is a side view of an optical-electrical (OE) package, in accordance with one embodiment of the present invention.

FIG. 1A is a side view of an optical-electrical (OE) package 10 in accordance with one embodiment of the present invention. OE package 10 includes a substrate package (hereinafter, "substrate") 20 having an upper surface 22 with a set 28 of contact-receiving members 30. Substrate 20 also includes a lower surface 32 having a first set 38 of contact-receiving members 39 and a second set 40 of contact-receiving members 41. Substrate 20 is also referred to as an "interposer," and is a passive device containing conductors 50A and 50B (FIG. 1B) arranged to perform the spatial transformation between the set of contact-receiving members 28 on the upper surface and the sets of contact-receiving members 38 and 40 on the lower surface.

Figure 1B:
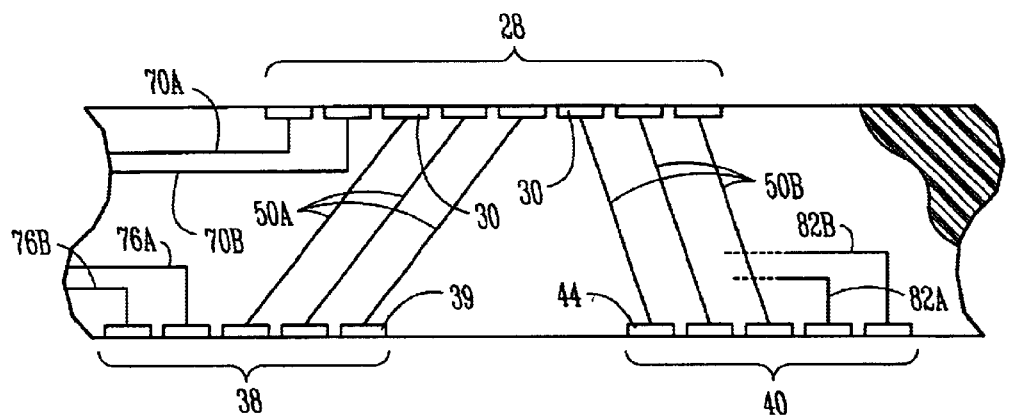
FIG. 1B is a close-up cross-sectional view of the substrate of the OE package of FIG. 1A, showing the various contact-receiving members and conductors within the substrate.

FIG. 1B is a close-up cross-sectional view of the substrate of the OE package 10 of FIG. 1A, showing the various contact-receiving members and conductors within the substrate.

Referring again to FIG. 1A, attached (i.e., electrically coupled) to contact-receiving member set 28 is an integrated circuit (IC) chip 52 having contacts 54. In an example embodiment, contacts 54 are ball-type contacts or "bumps" and the IC chip is flip-bonded to the contact-receiving members 28. The IC chip may be, for example, a microprocessor chip or a memory chip.

Figure 1C:
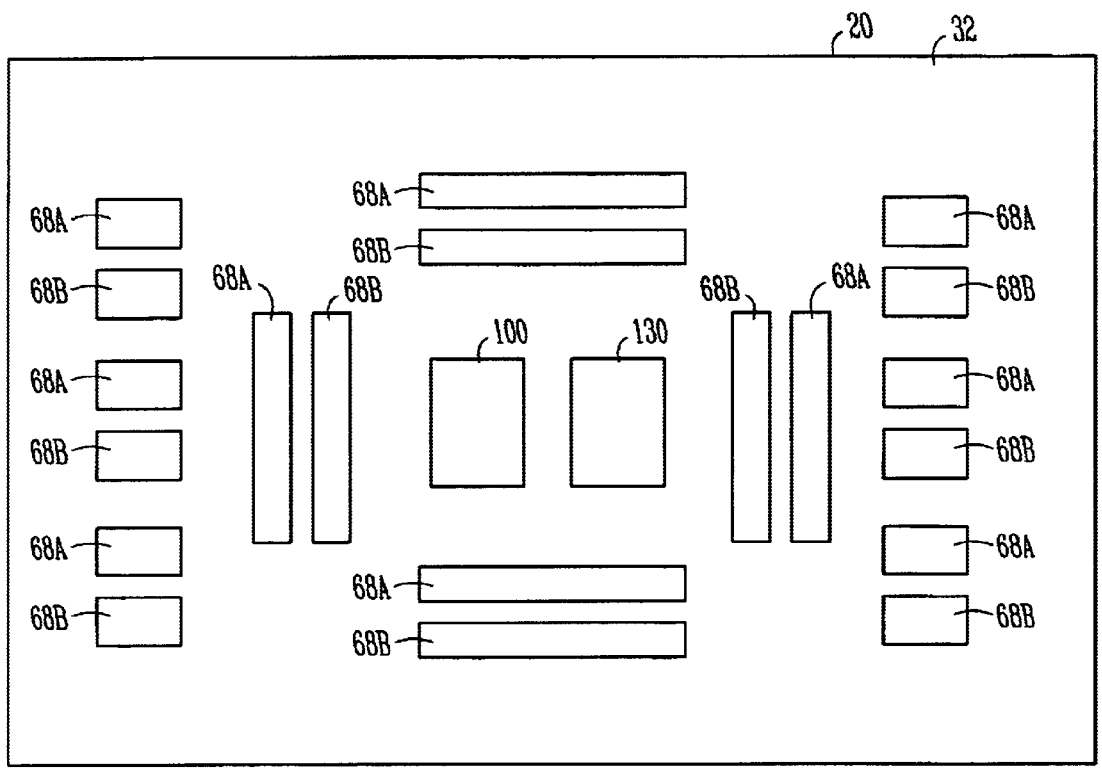
FIG. 1C is a bottom-up view of the substrate of the OE package of FIG. 1A showing light-emitting and photodetector packages along with power and ground contact pads that connect to capacitor DC shunts (CDCSs)

Substrate 20 also includes power and ground conductors 60A and 60B with a number of power/ground leads 66A and 66B that lead to power/ground contact pads 68A and 68B on lower surface 32 (FIG. 1C).

FIG. 1C is a bottom-up view of the substrate of the OE package 10 of FIG. 1A showing light-emitting and photodetector packages along with power and ground contact pads that connect to capacitor DC shunts (CDCSs).

Referring again to FIG. 1A; power and ground conductors 60A and 60B also include power/ground leads shown as 70A and 70B in FIG. 1B that are coupled to select contact-receiving members 28. Still referring to FIG. 1B, the power and ground conductors further include power/ground leads 76A and 76B that are coupled to select contact-receiving members 39, and power/ground leads 82A and 82B that are coupled to select contact-receiving members 41. The power/ground conductors and leads in the substrate (20, FIG. 1A) provide power and ground to devices coupled to the sets of contact-receiving members, as described in greater detail below. In an example embodiment, substrate 20 is formed from a polymer and is about 3 to 4 cm long and about 1 mm thick.

With continuing reference to FIG. 1A, electrically coupled to set of contact-receiving members 38 on the lower surface of the substrate 20 is a light-emitting package 100. The light-emitting package 100 includes a light-emitting array 102, such as a vertical cavity surface emitting laser (VCSEL) array, a light-emitting diode (LED) array, or a laser diode array. The light-emitting package 100 also includes a transimpedance amplifier array 104 coupled to the light-emitting array that receives output voltage signals and provides corresponding output current signals to the light-emitting array.

In an example embodiment, light-emitting package 100 includes on a backside 108 ball-type contacts 110 ("bumps"), and the light-emitting array is flip-chip bonded to the contact-receiving members 38 with the ball-type contacts 110. In another example embodiment, contacts 110 are pins and the contact-receiving members 38 are holes adapted to receive the pins. Light 112 is emitted from light emitting array 102 from a frontside 114. In an example embodiment, a microlens array 122 is arranged adjacent the frontside 114 of the light-emitting array 102 to focus and/or collimate the emitted light 112. In an example embodiment, the microlens array 122 is attached to the frontside 114 of the light-emitting array 102.

Also coupled to the lower surface of the substrate 20 at the contact-receiving member set 40 is a photodetector package 130. The photodetector package 130 includes a photodetector array 132 coupled to a transimpedance amplifier array 134. The latter receives input photocurrent signals from the photodetector array 132 and provides corresponding input voltage signals. In an example embodiment, photodetector array 132 includes on a backside 140 ball-type contacts 144, and the photodetector array 132 is flip-chip bonded to the contact-receiving members 40 with the ball-type contacts 144. In another example embodiment, the contacts are pins and the contact-receiving members 40 are holes adapted to receive the pins. Light 146 is detected at a frontside 150 of the photodetector array 132. In an example embodiment, a microlens array 156 is arranged adjacent the frontside 150 of the photodetector array 132 to focus light 146 onto the array 132. In an example embodiment, the microlens array 156 is attached to the frontside 150.

OE package 10 further includes a PCB or motherboard 200 having an upper surface 202 and internal power and ground conductors 206A and 206B coupled to a power source 208 and ground G, respectively. The power/ground conductors include a number of power/ground leads 21 OA and 21 OB leading to power/ground contacts 212A and 212B on the motherboard upper surface.

OE package 10 also includes a number of capacitor DC (direct current) shunts, or CDCSs 250 arranged between the motherboard 200 and the substrate 20. The CDCSs 250 are coupled to power/ground contacts 68A and 68B of the substrate 20 and to power/ground contacts 212A and 212B of the motherboard 200. The CDCSs 250 serve to space apart the substrate 20 and motherboard 200 while replacing the conventional ball-type or pin-type electrical leads between substrate 20 and motherboard 200. The CDCSs 250 provide part of the current path from power source 208 and motherboard conductors 210A and 210B to the substrate and conductors 60A and 60B, and thus to IC chip 52, light-emitting package 100, and photodetector package 130.

The CDCSs 250 act to limit noise generated by the IC chip 52 that can arise, for example, from the switching of the millions of transistors in a CPU. The reduction of noise is achieved by the CDCSs serving as local sources of current for the IC chip (beyond that available in the capacitors in the IC chip itself). In particular, the CDCSs provide current to eliminate the noise-producing current drops that would otherwise occur during transistor switching.

In example embodiments, the CDCSs 250 have a capacitance ranging from about 1 microfarad to 100 microfarads, depending on the application. For example, for relatively low speed applications such as cellular phones, the capacitance may be as low as 1 microfarad. On the other hand, for high-speed applications such as servers or high-end computers, the capacitance may be as high as 100 microfarads.

In general, the capacitance of the CDCSs is selected to mitigate noise generated by the IC chip.

Figure 2A:
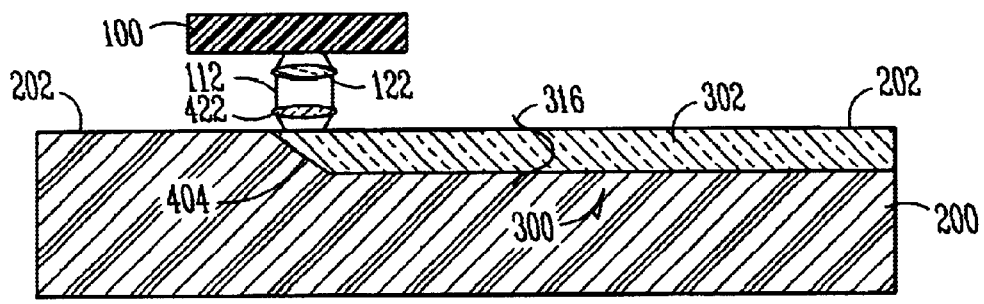
FIG. 2A is a close-up cross-sectional view of a light-emitting package coupled to one of the waveguides in an output waveguide array, in accordance with one embodiment of the invention.

FIG. 2A is a close-up cross-sectional view of a portion of motherboard 200 illustrating a light-emitting package 100 coupled to one of the waveguides 302 in an output waveguide array 300, in accordance with one embodiment of the invention.

Figure 2B:
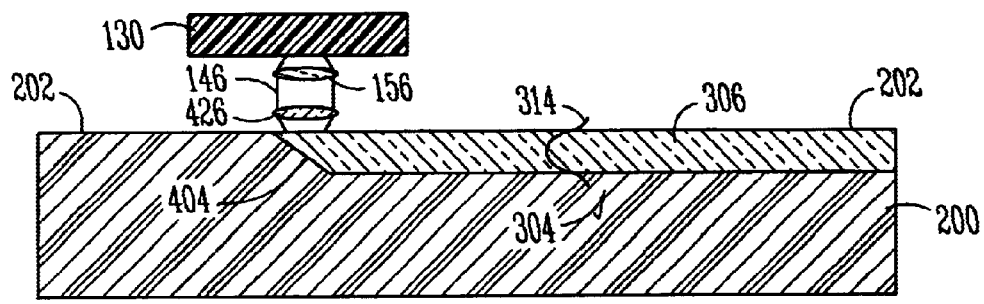
FIG. 2B is a close-up cross-sectional view of a photodetector package coupled to one of the waveguides in an input waveguide array, in accordance with one embodiment of the invention.

FIG. 2B is a close-up cross-sectional view of a photodetector package 130 coupled to one of the waveguides 306 in an input waveguide array 304, in accordance with one embodiment of the invention.

With reference to FIGS. 2A, motherboard 200 also includes an output optical waveguide array 300 made up of waveguides 302. Further, with reference to FIG. 2B, motherboard 200 also includes an input optical waveguide array 304 of waveguides 306. The waveguide arrays 300 and 304 are formed either atop or within upper surface 202. Waveguide array 300 is optically coupled to light-emitting array 102 (FIG. 1), and input,optical waveguide array is optically coupled to photodetector array 132 (FIG. 2). The input optical waveguide array carries input optical signals 314 and the output optical waveguide array carries output optical signals 316.

In an example embodiment, the input and output waveguide arrays comprise a polymer waveguide sheet laminated to upper surface 202. Polymer waveguides are particularly well suited for transmitting light of infrared wavelength (e.g., 0.850 microns, 1.3 microns, 1.55 microns, etc), which are commonly used wavelengths for chip-to-chip and other optical telecommunications applications. Also, polymer waveguides are well-suited for use with motherboard 200, which in an example. embodiment is also formed from a polymer. Suitable polymer waveguide sheets are available from Optical Crosslinks, Inc., Kennet Square, Pa.

Figure 3A:
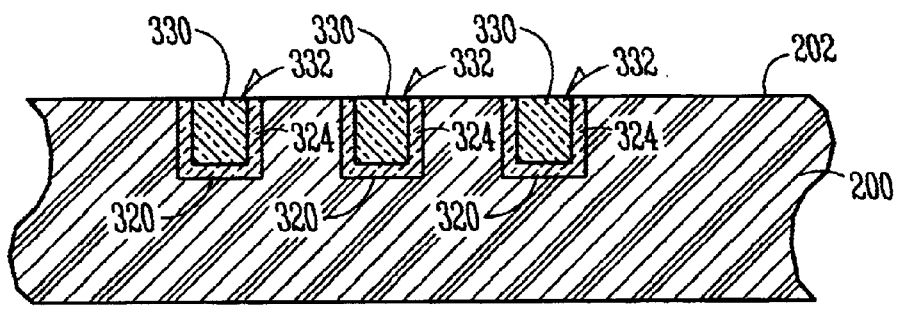
FIG. 3A is a close-up cross-sectional view of channel waveguides formed in the upper surface of a substrate, illustrating one embodiment for forming input and/or output waveguide arrays.

FIG. 3A is a close-up cross-sectional view of channel waveguides 332 formed in the upper surface of a substrate 200, illustrating one embodiment for forming input and/or output waveguide arrays 300 and 304.

Waveguide arrays 300 and 304 may also be formed in upper surface 202 using standard waveguide fabrication techniques. With reference to FIG. 3A, one such technique includes forming channels 320 in the upper surface and lining the channels with a low-index material 324, such as a low-index polyimide. The lined channels are then filled with a high-index cladding layer 330, such as a high-index polyimide. The formation of such waveguides 332 (referred to also as "channel waveguides") may be preferred when it is desirable to reduce the separation between the substrate and the motherboard.

Figure 3B:
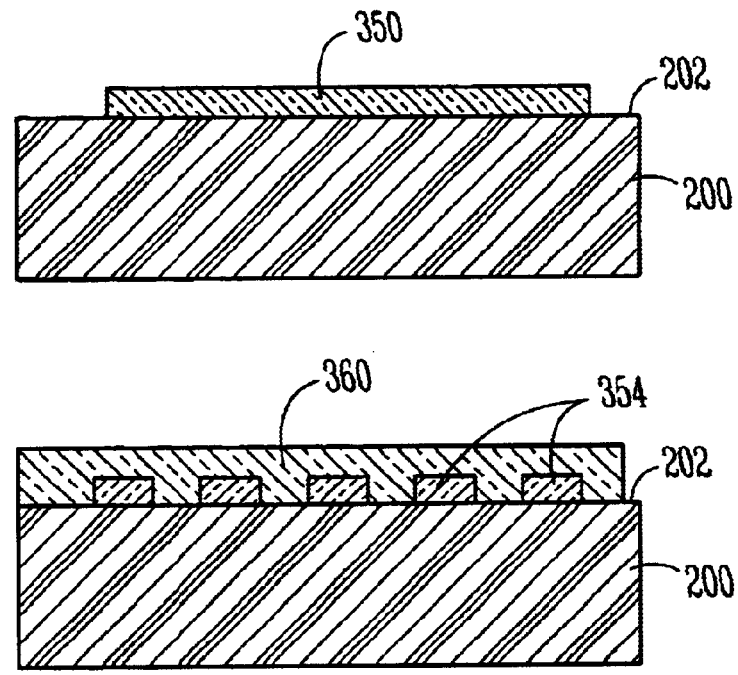
FIG. 3B is a close-up cross-sectional view of a substrate, illustrating another embodiment for forming input and/our output waveguide arrays atop a substrate upper surface.

FIG. 3B is a close-up cross-sectional view of a substrate 200, illustrating another embodiment for forming input and/our output waveguide arrays 300 and 304 atop a substrate upper surface 202.

With reference to FIG. 3B, another technique for forming waveguide arrays 300 and 304 involves depositing or otherwise forming a first layer 350 of high-index core material atop upper surface 202, patterning the first layer to form high-index waveguide cores 354, and then depositing a low-index cladding layer 360 atop the waveguide cores.

Figure 3C:
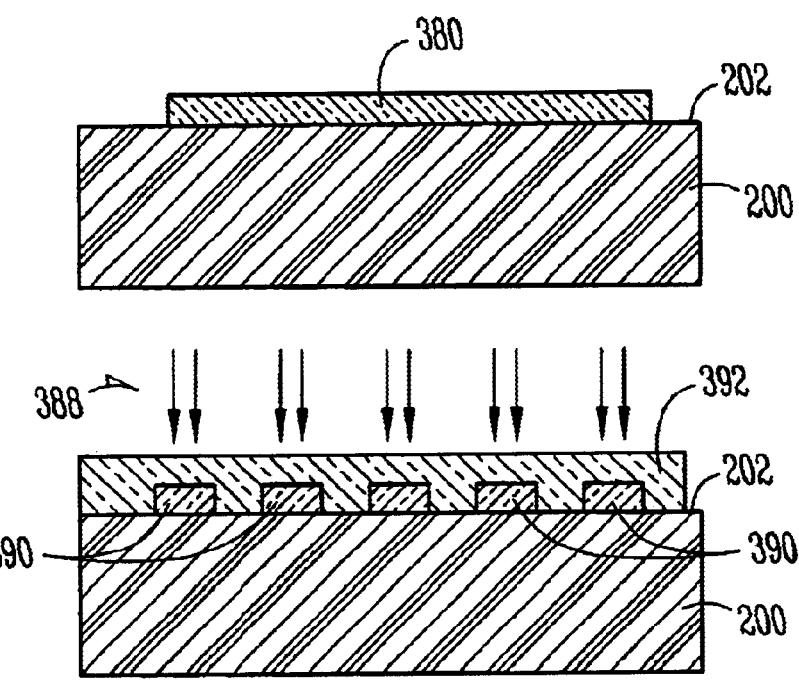
FIG. 3C shows close-up cross-sectional views of a substrate, illustrating another embodiment for forming input and/our output waveguide arrays atop a substrate upper surface by irradiating a photosensitive polymer.

FIG. 3C shows close-up cross-sectional views of a substrate 200, illustrating another embodiment for forming input and/our output waveguide arrays 300 and 304 atop a substrate upper surface 202 by irradiating a photosensitive polymer.

With reference to FIG. 3C, another technique for forming waveguide arrays 200 and 230 involves depositing a layer 380 of photosensitive polymer that undergoes a change in refractive index when exposed to a select wavelength of radiation. An example polymer is acrylate, available from Dupont, Inc., Wilmington, Del. The waveguide array is then formed by selectively irradiating the photosensitive polymer with radiation 388 of the select wavelength (e.g., by masking the layer 380) to form high-index regions 390 within layer 380. A low-index layer 392 (e.g., the same material as layer 380) is then formed atop the structure to complete the cladding.

With reference again to FIGS. 2A and 2B, in an example embodiment, waveguides arrays 300 and 304 are coupled to light-emitting array 102 and/or photodetector array 132 by respective beveled ends 404 and 406 formed in each waveguide in the arrays.

Figure 4:
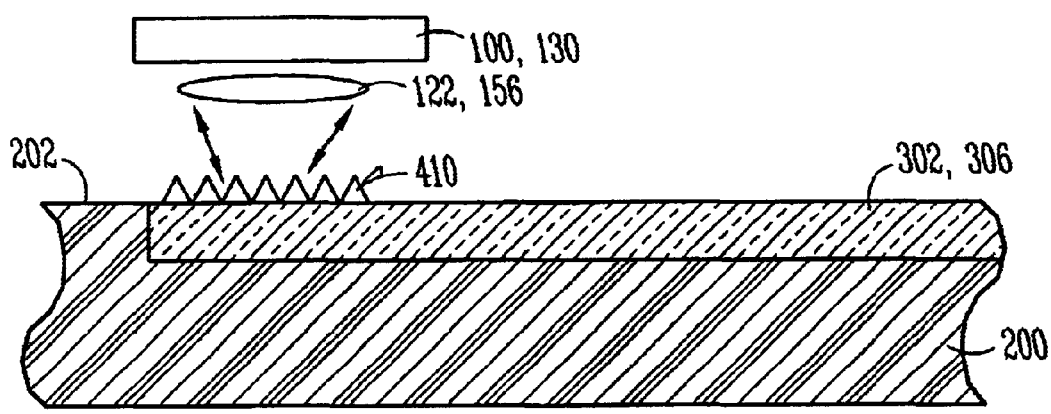
FIG. 4 is a close-up cross-sectional view of either a light-emitting package and an, output waveguide or a photodetector package and input waveguide, illustrating the use of a grating coupler, in accordance with one embodiment of the invention.

FIG. 4 is a close-up cross-sectional view of either a light-emitting package 100 and an output waveguide 302 or a photodetector package 130 and input waveguide 306, illustrating the use of a grating coupler, in accordance with one embodiment of the invention. In another example embodiment illustrated in FIG. 4, waveguide arrays 300 and/or 304 are coupled to the light-emitting array and/or the photodetector array via a grating 410. The grating is preferably designed to directionally diffract light 112 (e.g., output optical signals) from light-emitting array 102 into waveguide 302, or directionally diffract light 146 (e.g., input optical signals) out of waveguide 306 and to photodetector array 132.

With reference again to FIG. 1, in another example embodiment, microlens arrays 422 and 426 may be formed adjacent the output and input waveguide arrays, respectively, to facilate coupling of light between the waveguide arrays and the light-emitting and photodetector arrays. In an example embodiment, microlens arrays 422 and 426 are attached to the output and input waveguide arrays, respectively.

Method of Operation

OE package 10 operates to receive input optical signals 314 and generate output optical signals 316. Thus, in operation input waveguide array 304 carries input optical signals 314 (FIG. 2B), which are detected by photodetector array 102. The photodetector array outputs photocurrent signals corresponding to the detected input optical signals. The photocurrent signals are received by transimpedance amplifier array 104, which converts the photocurrent signals to input voltage signals. The input voltage signals travel through one or more of the contact-receiving members 41 and the associated contacts 144. The signals then travel through select conductors 50B to select contact receiving members 30 and associated contacts 54, and then to IC chip 52.

The IC chip processes the input voltage signals and generates output voltage signals. The output voltage signals travel through select IC chip contacts 54 and associated contact-receiving members 30 to conductors 50A. The output voltage signals travel through select contact-receiving members 39 and associated contacts 110 and are received by traiqsimpedance amplifier array 104. The latter converts the output voltage signals to output current signals, which are received by light-emitting array 102. The light-emitting array then emits output optical signals 316, which are received and carried by output waveguide array 300.

In combination with the above, electrical power is supplied to the OE package 10 from power source 208 via power conductor 206A (in conjunction with ground conductor 206B), through CDCSs 250, and to the IC chip, the light-emitting package and the photodetector package. As discussed above, the use of the CDCSs provides for reduced noise while obviating the need for conventional package leads (e.g., in the form of balls or pins), which tend to heat and cause reliability issues.

Method of Fabrication

Figure 5:
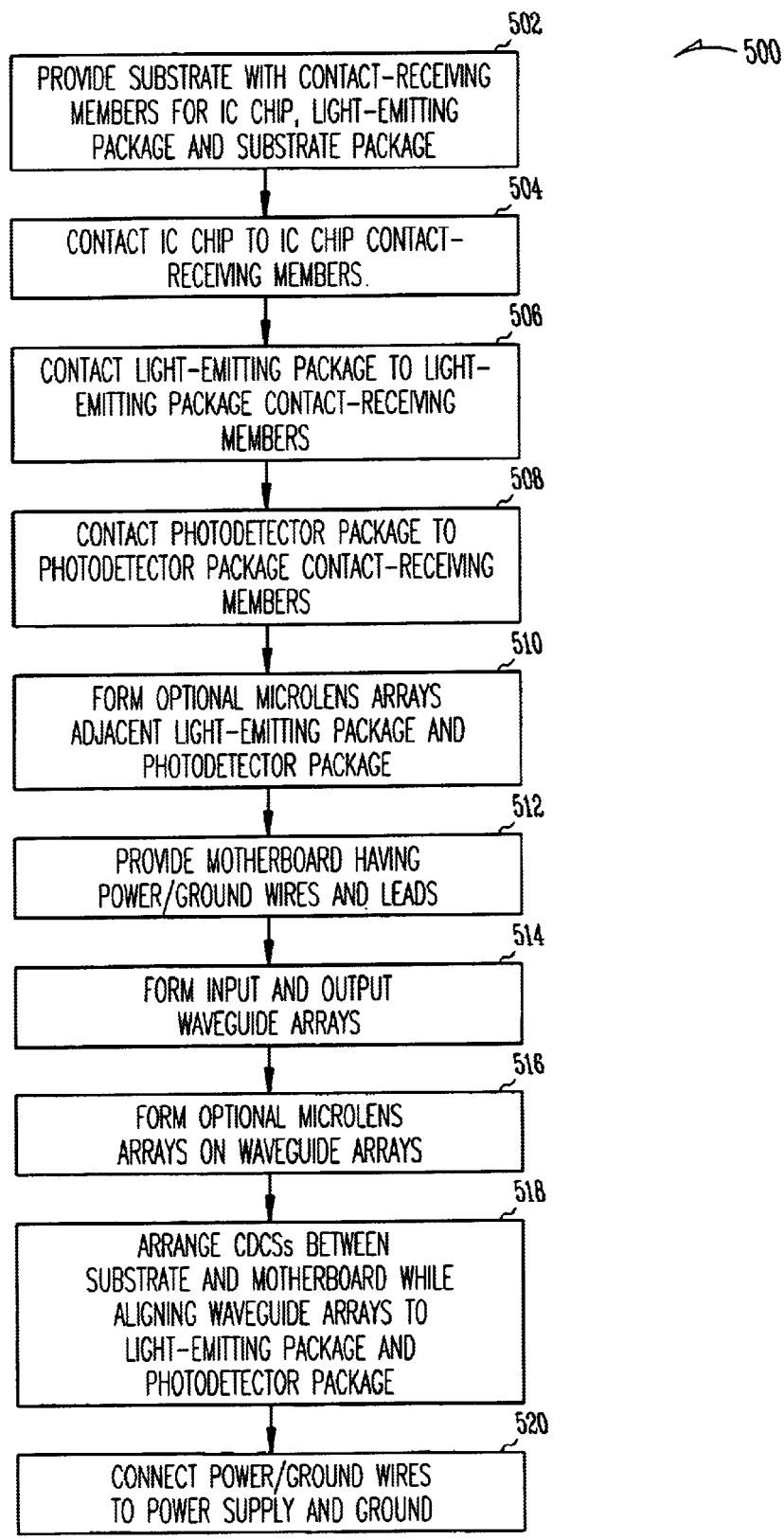
FIG. 5 is a flow diagram outlining a method for fabricating the OE package of FIG. 1, in accordance with one embodiment of the invention.

FIG. 5 is a flow diagram 500 outlining a method for fabricating the OE package 10 of FIG. 1, in accordance with one embodiment of the invention. First, in 502, substrate 20 with internal power and ground conductors 60A and 60B, and having sets 28, 38 and 40 of contact-receiving members as described above, is provided. Next, in 504, IC chip 52 is electrically and mechanically coupled to contact-receiving member set 28. In an example embodiment, this is accomplished using flip-chip bonding of ball-type (i.e., "bump") contacts. Likewise, in 506 and 508, light-emitting package 100 and photodetector package 130 are coupled to contact-receiving member sets 38 and 40, respectively. In an example embodiment, these packages are also flip-chip bonded with bump contacts.

Next, in 510, microlens arrays 122 and 156 are optionally formed adjacent the light-emitting array and the photodetector array to facilitate the efficient emission and reception of light.

Next, in 512, motherboard 200 with power/ground conductors 206A and 206B and leads 21 OA and 21 OB is provided. Then in 514, output and input waveguide arrays 300 and 304 are formed atop or within upper surface 202 of the motherboard. In 516, microlens arrays 420 and 426 are optionally formed adjacent the waveguide arrays to facilitate efficient optical coupling between waveguide arrays and the light-emitting array and photodetector array.

In 518, CDCSs 250 are arranged between substrate lower surface 32 and motherboard upper surface 202 and are coupled to power/ground contacts 68A and 68B of the substrate and power/ground contacts 212A and 212B of the motherboard. Prior to permanently interfacing the substrate and the motherboard using the CDCSs, care should be taken to ensure alignment of the light-emitting array with the output waveguide array and the photodetector array with the input waveguide array for optimal optical coupling:

Finally, in 520, motherboard power/ground conductors 206A and 206 are electrically coupled to power supply 208 and ground G, respectively.

The above method represents one representative embodiment of a method of fabricating the OE package of the present invention. Other embodiments include performing the above method in an order different than that presented above.

Chip-to-Chip Communication System

Figure 6:
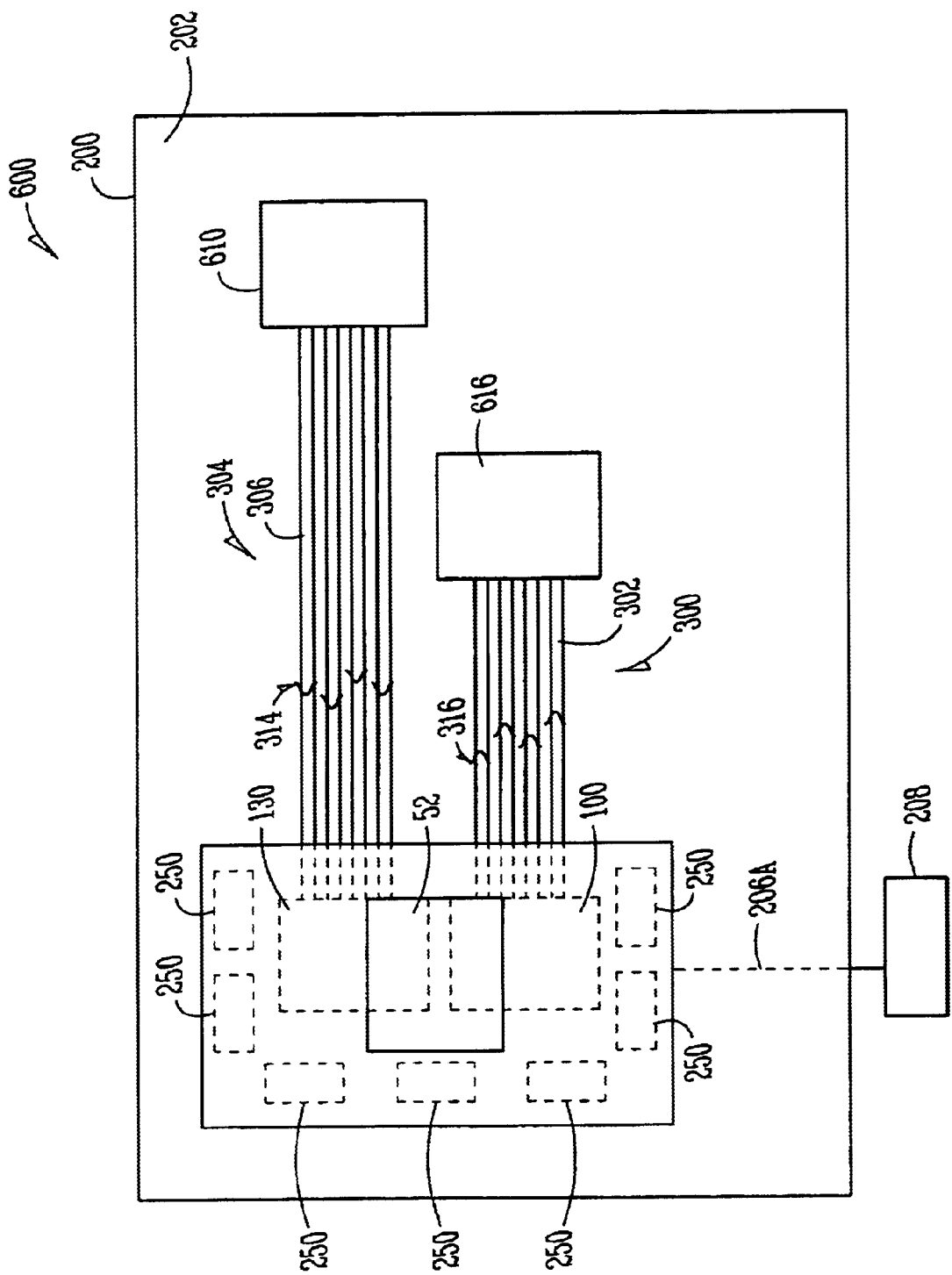
FIG. 6 is a plan view of a chip-to-chip communication system employing the OE package of FIG. 1, in accordance with one embodiment of the invention.

FIG. 6 is a plan view of a chip-to-chip communication system 600 employing the OE package 10 of FIG. 1, in accordance with one embodiment of the invention. Input waveguide array 304 is coupled at one end to an optoelectronic device ("chip") 610 on the motherboard, while output waveguide array 300 is coupled at one end to another optoelectronic device ("chip") 616. Chips 610 and 616 include, in an example embodiment, microprocessors, while in another example embodiment they include a microprocessor and a memory chip. The OE package is electrically coupled to power supply 208 via power conductor 206A of motherboard 200.

Optoelectronic device 610 emits input optical signals 314 that travel down the input waveguide array 306 to the OE package. As described above, the optical signals 314 are detected by the photodetector package 130 and converted to input voltage signals, which are then processed by IC chip 52. The output voltage signals produced by IC chip 52 are then sent to the light-emitting package, where the signals are converted to output optical signals 316. These output signals are coupled into the output waveguide array. The output optical signals then travel to device 616, where they are received and processed.

Chip-to-chip communication system 600 has the ability to provide high-speed, low-noise optical communication between IC chips 52, 610 and 616, because the CDCSs reduce the signal noise while also reducing or eliminating the overheating that normally occurs when providing high power to high-speed IC chips.

The various elements depicted in the drawings are merely representational and are not drawn to scale. Certain proportions thereof may be exaggerated, while others may be minimized. The drawings are intended to illustrate various implementations of the invention, which can be understood and appropriately carried out by those of ordinary skill in the art.

While certain elements have been described herein relative to "upper" and "lower", "left" and "right", "atop" and "below," and "front" and "back", it will be understood that these descriptors are relative, and that they could be reversed if the elements were inverted, rotated, or mirrored. Therefore, these terms are not intended to be limiting.

It is emphasized that the Abstract is provided to comply with 37 C.F.R. §1.72(b) requiring an Abstract that will allow the reader to quickly ascertain the nature and gist of the technical disclosure. It is submitted with the understanding that it will not be used to interpret or limit the scope or meaning of the claims.

In the foregoing Detailed Description of Embodiments of the Invention, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description of Embodiments of the Invention, with each claim standing on its own as a separate preferred embodiment.

While the present invention has been described in connection with preferred embodiments, it will be understood that it is not so limited. On the contrary, it is intended to cover all alternatives, modifications and equivalents as may be included within the spirit and scope of the invention as defined in the appended claims.

What is claimed is:

1. An optical-electrical (OE) package comprising:
   a substrate electrically coupled to a circuit board via one or more capacitor DC shunts (CDCSs), the circuit board having first and second waveguide arrays;
   an IC chip electrically coupled to a first set of contact-receiving members on an upper surface of the substrate; and
   a light-emitting package and a photodetector package electrically coupled to respective second and third sets of contact-receiving members on a substrate lower surface, so as to be in electrical communication to the IC chip, the light-emitting package being optically coupled to the first waveguide array and the photodetector package being optically coupled to the second waveguide array.

2. The OE package of claim 1, wherein the light-emitting package includes an array of light-emitting devices coupled to a first array of transimpedance amplifiers.

3. The OE package of claim 2, wherein the light-emitting array includes one of a vertical cavity surface emitting laser (VCSEL) array, a light-emitting diode (LED) array, or a laser diode array.

4. The OE package of claim 2, wherein the photodetector package includes an array of photodetectors coupled to a second array of transimpedance amplifiers.

5. The OE package of claims 4, further including first and second microlens arrays arranged adjacent the light-emitting array and the photodetector array, respectively.

6. The OE package of claim 5, further including a third microlens array arranged adjacent the first waveguide array and a fourth microlens array arranged adjacent the second waveguide array.

7. The OE package of claim 1, wherein at least one of the IC chip, the light-emitting package and the photodetector package are flip-chip coupled to the substrate.

8. The OE package of claim 1, wherein the CDCSs have a capacitance in the range from about 1 microfarad to about 100 microfarads.

9. An optical-electrical (OE) package comprising:
   a substrate electrically coupled to a circuit board via one or more capacitor DC shunts (CDCSs), the circuit board having first and second waveguide arrays:

an IC chip electrically coupled to a first set of contact-receiving members on an upper surface of the substrate: and a light-emitting package and a photodetector package electrically coupled to respective second and third sets of contact-receiving members on a substrate lower surface, so as to be in electrical communication to the IC chip the light-emitting package being optically coupled to the first waveguide array and the photodetector package being optically coupled to the second waveguide array, wherein the substrate and circuit board each include power and ground conductors with leads coupled to the one or more CDCSs.

10. The OE package of claim 9, wherein the power conductor in the circuit board is coupled to a power source.

11. The QE package of claim 9, wherein the light-emitting package includes an array of light-emitting devices coupled to a first array of transimpedance amplifiers.

12. The OE package of claim 11, wherein the light-emitting array includes one of a vertical cavity surface emitting laser (VCSEL) array, a light-emitting diode (LED) array, or a Iaser diode array.

13. The OE package of claim 11, wherein the photodetector package includes an array of photodetectors coupled to a second array of transimpedance amplifiers.

14. The OE package of claim 13, further including first and second microlens arrays arranged adjacent the light-emitting array and the photodetector array, respectively.

15. The OE package of claim 14, further including a third microlens array arranged adjacent the first waveguide array and a fourth microlens array arranged adjacent the second waveguide array.

16. The OE package of claim 9, wherein at least one of the IC chip, the light-emitting package and the photodetector package are flip-chip coupled to the substrate.

17. The OE package of claim 9, wherein the CDCSs have, a capacitance in the range from about 1 microfarad to about 100 microfarads.

18. An optical-electrical (OE) package, comprising:
a first IC chip, a light-emitting package, and a photodetector package each electrically coupled to respective sets of contact-receiving members of a substrate; and capacitor DC shunts (CDCSs) electrically coupled to the substrate and to couple to a motherboard.

19. An optical-electrical (OE) package comprising:
a first IC chip a light-emitting package, and a photodetector package each electrically coupled to respective sets of contact-receiving members of a substrate:
capacitor DC shunts (CDCSs) electrically coupled to the substrate; and
the a motherboard electrically coupled to the substrate through the CDCSs, the motherboard including first and second waveguide arrays optically coupled to the light-emitting package and the photodetector package, respectively.

20. The OE package of claim 19, wherein the light-emitting package includes one of a vertical cavity surface emitting laser (VCSEL) array, a light-emitting diode (LED) array, or a laser diode array.

21. The OE package of claim 20, wherein the photodetector package includes an array of photodetectors coupled to an array of transimpedance amplifiers.

22. A system, comprising:
an optical-electrical package that includes a first IC chip, a light-emitting package, and a photodetector package each electrically coupled to respective sets of contact-receiving members of a substrate, and capacitor DC shunts (CDCSs) electrically coupling the substrate to a motherboard;
first and second waveguide arrays formed on the motherboard and optically coupled at respective first ends to the light-emitting package and the photodetector package; and
second and third IC chips mounted on the motherboard and optically coupled to respective second ends of the first and second waveguide arrays.

23. The system of claim 22, wherein the first and second waveguides each include a plurality of channel waveguides formed in an upper surface of the substrate.

24. A system, comprising:
an optical-electrical package that includes a first IC chip, a light-emitting package, and a photodetector package each electrically coupled to respective sets of contact-receiving members of a substrate and capacitor DC shunts (CDCSs) electrically coupling the substrate to a motherboard;
first and second waveguide arrays formed on the motherboard and optically coupled at respective first ends to the light-emitting package and the photodetector package; and second and third IC chips mounted on the motherboard and optically coupled to respective second ends of the first and second waveguide arrays, wherein at least one of the first, second and third IC chips includes a microprocessor.

25. A system, comprising:
an optical-electrical package that includes a first IC chip, a light-emitting package and a photodetector package each electrically coupled to respective sets of contact-receiving members of a substrate, and capacitor DC shunts (CDCSs) electrically coupling the substrate to a motherboard:
first and second waveguide arrays formed on the motherboard and optically coupled at respective first ends to the light-emitting package and the photodetector package: and second and third IC chips mounted on the motherboard and optically coupled to respective second ends of the first and second waveguide arrays, further including a power supply electrically coupled to a conductor within the substrate.

26. A system comprising:
an optical-electrical package that includes a first IC chip, a light-emitting package and a photodetector package each electrically coupled to respective sets of contact-receiving members of a substrate, and capacitor DC shunts (CDCSs) electrically coupling the substrate to a motherboard:
first and second waveguide arrays formed on the motherboard and optically coupled at respective first ends to the light-emitting package and the photodetector package: and second and third IC chips mounted on the motherboard and optically coupled to respective second ends of the first and second waveguide arrays wherein the first and second waveguide arrays are formed from polymer sheets fixed to an upper surface of the motherboard.

* * * * *

UNITED STATES PATENT AND TRADEMARK OFFICE
CERTIFICATE OF CORRECTION

PATENT NO. : 6,624,444 B1
DATED : September 23, 2003
INVENTOR(S) : Yuan-Liang Li It is certified that error appears in the above-identified patent and that said Letters Patent is hereby corrected as shown below:

<u>Column 9,</u>
Line 2, delete ":" and insert -- ; -- therefor.
Line 44, insert -- , -- after "package".
Line 45, insert -- , -- after "chip".
Line 47, delete ":" and insert -- ; -- therefor.
Line 51, delete "the" before "a".

<u>Column 10,</u>
Line 21, insert -- , -- after "substrate".
Line 39, delete ":" after "motherboard" and insert -- ; -- therefor.
Line 43, delete ":" after "package" and insert -- ; -- therefor.
Line 48, insert -- , -- after "system".
Line 50, insert -- , -- after "package".
Line 54, delete ":" after "motherboard" and insert -- : -- therefor.
Line 58, delete ":" after "package" and insert -- ; -- therefor.
Line 60, insert -- , -- after "arrays".

Signed and Sealed this

Seventeenth Day of February, 2004

JON W. DUDAS
*Acting Director of the United States Patent and Trademark Office*